United States Patent [19]

Draxelmayr

[11] Patent Number: 4,999,633
[45] Date of Patent: Mar. 12, 1991

[54] SELF-CALIBRATING A/D AND D/A CONVERTER

[75] Inventor: Dieter Draxelmayr, Villach, Austria

[73] Assignee: Siemens Aktiengesellschaft, Munich, Fed. Rep. of Germany

[21] Appl. No.: 415,061

[22] Filed: Sep. 29, 1989

[30] Foreign Application Priority Data

Sep. 30, 1988 [EP] European Pat. Off. ........ 88116230.9

[51] Int. Cl.$^5$ ............................................. H03M 1/10
[52] U.S. Cl. .................................. 341/120; 341/118; 341/145; 341/156; 341/150; 341/153; 341/161; 341/172
[58] Field of Search ............... 341/172, 150, 153, 161, 341/118, 120, 145, 156

[56] References Cited

U.S. PATENT DOCUMENTS

| | | | |
|---|---|---|---|
| 4,077,035 | 2/1978 | Yee | 341/153 |
| 4,399,426 | 8/1983 | Tan | 341/172 |
| 4,568,917 | 2/1986 | McKenzie et al. | 341/150 |
| 4,709,225 | 11/1987 | Welland et al. | 341/172 |
| 4,843,393 | 6/1989 | Kuraishi | 341/150 |

Primary Examiner—William M. Shoop, Jr.
Assistant Examiner—Randy W. Gibson
Attorney, Agent, or Firm—Herbert L. Lerner; Laurence A. Greenberg

[57] ABSTRACT

A self-calibrating A/D and D/A converter operating according to the principle of charge redistribution includes a weighted capacitive primary converter network for most significant bits, a subsidiary converter network for bits of lesser significance, and a calibration and correction network. Each of the networks have capacitors. A comparator has an input connected to a node point. The capacitors of the primary converter network are each connected to the node point. A coupling capacitor is connected between the capacitors of the subsidiary converter network and the node point. Another coupling capacitor is connected between the capacitors of the calibration and correction network and the node point.

10 Claims, 1 Drawing Sheet

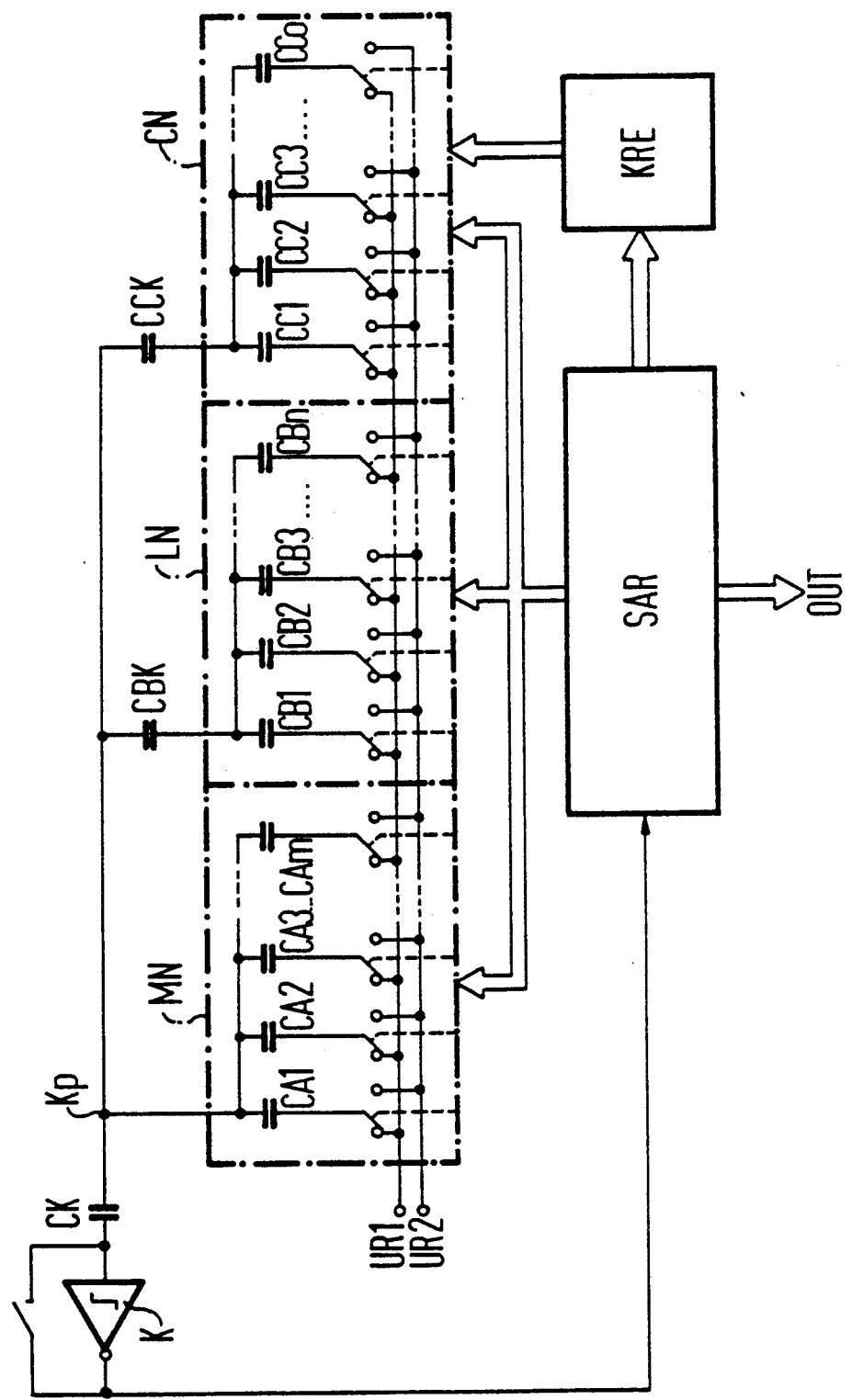

SELF-CALIBRATING A/D AND D/A CONVERTER

The invention relates to a self-calibrating A/D and D/A converter operating according to the principle of charge redistribution, having a weighted capacitive primary converter network for the most significant bits, with capacitors which are each connected to a node point, a comparator having an input connected the node point, and a subsidiary converter network for the bits of lesser significance and a calibration and correction network, each of which are connected through a respective coupling capacitor to the node point.

The most important and most critical interface between different types of systems is usually the connection between the analog and digital portions of the systems. The interface between a digital circuit and an analog circuit requires a D/A converter, while the interface between an analog circuit and a digital circuit correspondingly requires an A/D converter. An ideal converter, which naturally does not exist in actuality, would convert a digital or analog signal, as applicable, into an analog or digital signal without delay and without error.

In many types of A/D and D/A converters, reference elements are needed, which derive further variables from a predetermined reference variable that are used for a conversion. These reference elements form a weighted network. In practice, the weighted networks are usually achieved by means of resistors, capacitors or transistors. Such converters operate, for instance, by the method of successive approximation. A converter with charge redistribution in which the weighted network is formed of capacitors, can be considered an example of such a converter.

In converters having a weighted network, it is important that the weighted elements be at a precisely predetermined ratio to one another. For high-precision converters, the weighted elements must be highly precise. However, problems arise because the weighted elements cannot be manufactured with sufficient precision. Typically, a correction is therefore made, for instance by trimming or by the use of correcting PROMs, but these methods have disadvantages.

Another possibility for calibrating A/D or D/A converters is that of self-calibration and is known, for instance, from U.S. Pat. No. 4,451,821 to Domogalla, and from the publication by H. S. Lee and D. Hodges, entitled "Self-Calibration Technique for A/D Converters", IEEE Transactions on Circuits and Systems, Vol. CAS-30, No. 3, March 1983, page 188.

The method of successive approximation described above has the prerequisite of a binary weighted network, in which the smallest element is present in duplicate. With such a device, in the ideal case a weighted element is identically equal to the sum of all of the elements (bits). In that type of self-calibration, the deviation from the weighting sum of all of the respectively lower-weighted elements is ascertained incrementally for each weighted element of the network. From that difference, which is ideally zero, it is clearly possible to determine the weighting error associated with each weighted element, and that error can be stored in memory and then used in a conversion operation for correcting the result. Usually, the weighting error is ascertained and stored in memory with the aid of a weighted correction network. In order to assign the correction weights to the various weighted reference elements, an arithmetic unit, for instance a microcomputer, is required.

The use of a plurality of capacitive networks for error correction is known from U.S. Pat. No. 4,399,426 to Tan.

In the publication by Lee and Hodges mentioned above, a self-calibrating A/D converter is described which uses a weighted capacitive primary network and a subsidiary network being formed of resistance conductors as a convertor network. The calibration and correction network is likewise formed of resistor conductors. Each of the two resistor networks is connected through a coupling capacitor to the common node point of the primary network, which also leads to one input of a comparator connected downstream thereof. A disadvantage of the converter described above is that currents that generate losses and reduce the attainable precision of the converter flow through the resistor networks even in the static state.

It is accordingly an object of the invention to provide a self-calibrating A/D and D/A converter, which overcomes the hereinafore-mentioned disadvantages of the heretofore-known devices of this general type and which has a low static power loss and makes a higher converter accuracy possible.

With the foregoing and other objects in view there is provided, in accordance with the invention, a self-calibrating A/D and D/A converter operating according to the principle of charge redistribution, comprising a weighted capacitive primary converter network for most significant bits, a subsidiary converter network for bits of lesser significance, a calibration and correction network, each of the networks having capacitors, a node point, a comparator having an input connected to the node point, the capacitors of the primary converter network each being connected to the node point, a coupling capacitor connected between the capacitors of the subsidiary converter network and the node point, and another coupling capacitor connected between the capacitors of the calibration and correction network and the node point.

An advantage of the invention is that due to the use of capacitive networks, no static currents flow and no static voltage drops appear, so that the power loss is minimal. In this way, substantial error sources can be prevented from having any effect.

In accordance with another feature of the invention, the capacitors of the networks are binary weighting capacitors having capacitances being independent of one another, the capacitors of each of the networks include a smallest weighting capacitor, and the smallest weighting capacitor of the subsidiary converter network is constructed, embodied or provided in duplicate.

In accordance with a further feature of the invention, the subsidiary converter network includes a correction capacitor for the least significant bit corresponding in value to one-half the smallest weighting capacitor.

In accordance with an added feature of the invention, the number of weighting capacitors in the converter networks depends on the bit resolution of the converter, and the primary converter network includes a number of weighting capacitors at least equal to that of the subsidiary converter network.

In accordance with an additional feature of the invention, the smallest weighting capacitor of the subsidiary converter network is equivalent to approximately twice the value of the smallest weighting capacitor of the primary converter network.

In accordance with yet another feature of the invention, the calibration and correction network includes a variable or selectable number of weighting capacitors, in particular being equivalent to approximately one-half the bit resolution of the converter.

In accordance with yet a further feature of the invention, the smallest weighting capacitor of the calibration and correction network is approximately half as large as the smallest weighting capacitor of the primary converter network.

In accordance with yet an added feature of the invention, the coupling capacitor connected between the capacitors of the subsidiary converter network and the node point has a capacitance equivalent to between 1 and 1.4 times the value of the smallest weighting capacitor of the primary converter network.

In accordance with a concomitant feature of the invention, the coupling capacitor connected between the capacitors of the calibration and correction network and the node point has a capacitance equivalent to between 0.1 and 1 times the value of the smallest weighting capacitor of the primary converter network.

Other features which are considered as characteristic for the invention are set forth in the appended claims.

Although the invention is illustrated and described herein as embodied in a self-calibrating A/D and D/A converter, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the drawing.

The drawing is a schematic and block circuit diagram of an exemplary embodiment of an A/D converter using the method of successive approximation with a weighted capacitor network.

Referring now to the single FIGURE of the drawing in detail, there is seen a converter including a weighted capacitive primary converter network MN having capacitors CA1–CAm, a capacitive subsidiary converter network LN having capacitors CB1–CBn, and a capacitive calibration and correction network CN having capacitors CC1–CCo. The capacitors of the three network regions MN, LN and CN are weighted, preferably in binary fashion. Each of the capacitors of the converter is assigned a controlled switch, in a switch network. The controlled switch can connect the appropriate capacitor to a terminal UR1 or UR2, each of which carries a reference voltage. The other connection of each capacitor in one of the three network regions is connected to a summation point of the respective network region. The summation point for the primary converter network MN is directly connected to a node point Kp. In contrast, the summation points for the subsidiary converter network LN and the calibration and correction network CN, are each connected through a respective coupling capacitor CBK and CCK to the node point Kp. The node point Kp is optionally connected through a further coupling capacitor CK to an input of a comparator K, the output of which controls a successive approximation register SAR. Firstly, the successive approximation register SAR has outputs OUT at which a digital, converted output signal can be picked up. Secondly, it controls the switches (which are not provided with reference numerals) that are associated with the converter capacitors. Thirdly, outputs thereof lead to a correction and calculation unit KRE. The correction and calculation unit KRE is in turn connected to the calibration and correction network CN.

In the schematic configuration shown in the drawing, it is assumed that optional time control units for controlling the successive approximation register, any non-illustrated multiplexers which are needed, and the control and calculation unit KRE are also provided, as in conventional circuits. Correspondingly, the control and calculation unit KRE includes the necessary calibration logic or microprocessor unit, memory elements and other elements required for the calibration and correction operation.

The capacitance of the capacitors of the three network regions MN, LN and CN are selectable independently of one another, given preferably binary weighting. The number of weighting capacitors in the primary and subsidiary converter networks MN and LN depends on the bit resolution of the converter. Preferably, the number of capacitors in the primary converter network MN is greater than or equal to the number in the subsidiary converter network LN. In a converter with twelve-bit resolution, for instance, the network MN may include eight capacitors, which permit a resolution of eight bits, while the network LN has a resolution of four bits with four weighting capacitors. The smallest weighting capacitor of the subsidiary converter network LN is selected so as to be double. Preferably, the subsidiary converter network LN also has a correction capacitor, which is equivalent to one-half the least significant bit (LSB/2). In the exemplary embodiment shown in the drawing, this means that for a twelve-bit converter, the primary converter network MN includes capacitances of $CA1 - CAm = 128 \times CA1$. In the subsidiary converter network LN, $CB1 = 0.5 \times CB2$, $CB2 = CB3$, and $CBn = 8 \times CB2$. Although the lowest weighting capacitor CB2 of the subsidiary converter network LN is independent of the lowest weighting capacitor CA1 of the primary converter network, CB2 will preferably be selected to be approximately equal to twice the value of CA1.

The capacitors of the calibration and correction network CN are likewise independent of the weighting capacitors CAi and CBi of the two converter network regions. The number of capacitors for the network region CN, that is the attainable resolution, is freely selectable and represents a compromise between the attainable accuracy and the expense involved. In the exemplary embodiment of a twelve-bit converter, six-bit resolution is preferably provided, or in other words six capacitors. Preferably, the smallest weighting capacitor CC1 of the calibration and correction network CN is approximately equal to one-half the value for the smallest weighting capacitor CA1 of the primary converter network.

In the case of a technology without stray capacitance, the coupling capacitor CBK for the subsidiary converter network LN is approximately equal to the value of the smallest weighting capacitor CA1 of the primary converter network. However, depending on the magnitude of the stray capacitance, which is dictated by the construction, the value is greater in practice. That is, it is between 1 and 1.4 times the value of the smallest weighting capacitor CA1 of the primary converter network MN. Since the error to be corrected is typically less than CA1, CBK is typically larger than the coupling capacitor CCK of the calibration and correction network CN. The coupling capacitor CCK is dependent on the capacitance of the smallest weighting capacitor CA1 of the primary converter network. Its magnitude depends on the calibration accuracy or on the error that can maximally be made to vanish by calibration. Depending on the construction of the converter configuration, its capacitance is between 0.1 and 1 times the smallest weighting capacitor CA1 of the network MN.

The converter configuration according to the invention is suitable both for self-calibration methods based on the smallest weighting capacitor and on the assumption that this is ideal, and for methods that consider the sum of all of the weighting capacitors to be ideal. In the latter method, a reduction in the expense for circuitry is obtained in terms of the correction, but that is countered by possibly greater expense in the digital area. This is not disadvantageous, however, precisely because in modern industrial processes, vary small structures can be made for digital logic, while greater circuit complication on the analog side is much more expensive to attain.

In the converter configuration according to the invention, correction charges are formed by means of the calibration and correction network CN and coupled-in through the coupling capacitor CCK. Since the network LN for the least significant bits is also capacitively constructed, the converter has an advantage over known converters having resistance conductors, which is that no static currents flow. As a result, on one hand the power loss is reduced, and on the other hand no static voltage drops are produced. In this way, substantial error sources, such as voltage drops from the substrate into the interior of the circuit to the connections for the reference potentials, are precluded, and a better offset performance as well as a better amplification characteristic are attained, so that greater accuracy can be attained. However, the optimal value for the coupling capacitor CBK of the subsidiary converter network LN must be determined as accurately as possible. If the layout is incorrect, then adaptation errors may arise with an increasing number of weighting capacitors of the subsidiary converter network LN, or in other words with increasing bit resolution, which are expressed in exaggerated non-linearities, and in particular differential non-linearities in the uncalibrated situation. However, this effect can be compensated for by layout and circuitry provisions, for instance by minimizing the stray capacitance or increasing the total capacitance of the subsidiary converter network LN. Moreover, there is also the option of ascertaining a possibly non-optimal construction value for the coupling capacitor CBK in the course of normal self-calibration and correcting it in the conversion.

A D/A converter can be made in the usual manner with the A/D converter described in the exemplary embodiment.

The foregoing is a description corresponding in substance to European Application 88 116 230.9, dated Sept. 30, 1988, the International priority of which is being claimed for the instant application, and which is hereby made part of this application. Any material discrepancies between the foregoing specification and the aforementioned corresponding European application are to be resolved in favor of the latter.

I claim:

1. Self-calibrating A/D and D/A converter operating according to the principle of charge redistribution, comprising a weighted capacitive primary converter network for most significant bits, a subsidiary converter network for bits of lesser significance, a calibration and correction network, each of said networks having capacitors, a node point, a comparator having an input connected to said node point, said capacitors of said primary converter network each being connected to said node point, a coupling capacitor connected between said capacitors of said subsidiary converter network and said node point, and another coupling capacitor connected between said capacitors of said calibration and correction network and said node point.

2. Converter according to claim 1, wherein said capacitors of said networks are binary weighting capacitors having capacitances being independent of one another, said capacitors of each of said networks include a smallest weighting capacitor, and said smallest weighting capacitor of said subsidiary converter network is provided in duplicate.

3. Converter according to claim 2, wherein said subsidiary converter network includes a correction capacitor for the least significant bit corresponding in value to one-half said smallest weighting capacitor.

4. Converter according to claim 2, wherein the number of weighting capacitors in said converter networks depends on the bit resolution of the converter, and said primary converter network includes a number of weighting capacitors at least equal to that of said subsidiary converter network.

5. Converter according to claim 2, wherein said smallest weighting capacitor of said subsidiary converter network is equivalent to approximately twice the value of said smallest weighting capacitor of said primary converter network.

6. Converter according to claim 2, wherein said calibration and correction network includes a variable number of weighting capacitors.

7. Converter according to claim 2, wherein said calibration and correction network includes a number of weighting capacitors equivalent to approximately one-half the bit resolution of the converter.

8. Converter according to claim 2, wherein said smallest weighting capacitor of said calibration and correction network is approximately half as large as said smallest weighting capacitor of said primary converter network.

9. Converter according to claim 2, wherein said coupling capacitor connected between said capacitors of said subsidiary converter network and said node point has a capacitance equivalent to between 1 and 1.4 times the value of said smallest weighting capacitor of said primary converter network.

10. Converter according to claim 2, wherein said coupling capacitor connected between said capacitors of said calibration and correction network and said node point has a capacitance equivalent to between 0.1 and 1 times the value of said smallest weighting capacitor of said primary converter network.

* * * * *